US012751309B2

(12) United States Patent
Geyik et al.

(10) Patent No.: US 12,751,309 B2

(45) Date of Patent: Sep. 29, 2026

(54) INTEGRATED CIRCUIT PACKAGES WITH SILVER AND SILICON NITRIDE MULTI-LAYER

(71) Applicant: Intel Corporation, Santa Clara, CA (US)

(72) Inventors: Cemil S. Geyik, Gilbert, AZ (US); Kristof Kuwawi Darmawikarta, Chandler, AZ (US); Zhiguo Qian, Chandler, AZ (US); Kemal Aygun, Tempe, AZ (US); Jung Kyu Han, Chandler, AZ (US); Srinivas V. Pietambaram, Chandler, AZ (US); Rengarajan Shanmugam, Chandler, AZ (US); Robert L. Sankman, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 206 days.

(21) Appl. No.: 17/851,957

(22) Filed: Jun. 28, 2022

(65) Prior Publication Data

US 2023/0420358 A1 Dec. 28, 2023

(51) Int. Cl.

| | |
|---|---|
| ***H10W 70/69*** | (2026.01) |
| ***H10W 70/05*** | (2026.01) |
| ***H10W 70/60*** | (2026.01) |
| ***H10W 70/685*** | (2026.01) |

(52) U.S. Cl.

CPC ........... *H10W 70/69* (2026.01); *H10W 70/05* (2026.01); *H10W 70/611* (2026.01); *H10W 70/685* (2026.01)

(58) Field of Classification Search

CPC ........ H05K 1/141; H05K 1/111; H05K 1/181; H05K 2201/10098

USPC .......................................................... 361/760

See application file for complete search history.

(56) References Cited

U.S. PATENT DOCUMENTS

| | | | | |
|---|---|---|---|---|
| 8,779,589 | B2 | 7/2014 | Simka et al. | |
| 2011/0019381 | A1* | 1/2011 | Kawano | H05K 1/186 361/783 |
| 2012/0074507 | A1* | 3/2012 | Jo | H10N 70/8416 257/E21.616 |
| 2019/0363046 | A1* | 11/2019 | Sankman | H01L 21/486 |
| 2020/0075851 | A1* | 3/2020 | Karpov | H10B 63/24 |

FOREIGN PATENT DOCUMENTS

WO WO-2013181905 A1 * 12/2013 ......... H10D 30/6755

* cited by examiner

*Primary Examiner* — Andargie M Aychillhum

(74) *Attorney, Agent, or Firm* — Akona IP PC

(57) ABSTRACT

Disclosed herein are silver-coated conductive structures in integrated circuit (IC) package supports, as well as related methods and devices. For example, in some embodiments, an IC package support may include a conductive line, a first material layer on a top surface and on side surfaces of the conductive line, the first material layer including silver, and a second material layer on the first material layer, the second material layer including silicon or aluminum, and one or more of nitrogen and oxygen.

20 Claims, 7 Drawing Sheets

INTEGRATED CIRCUIT PACKAGES WITH SILVER AND SILICON NITRIDE MULTI-LAYER

BACKGROUND

The performance of some integrated circuit (IC) elements, such as high-speed signaling, may be enhanced by the use of silver materials.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

DETAILED DESCRIPTION

Figure 1:
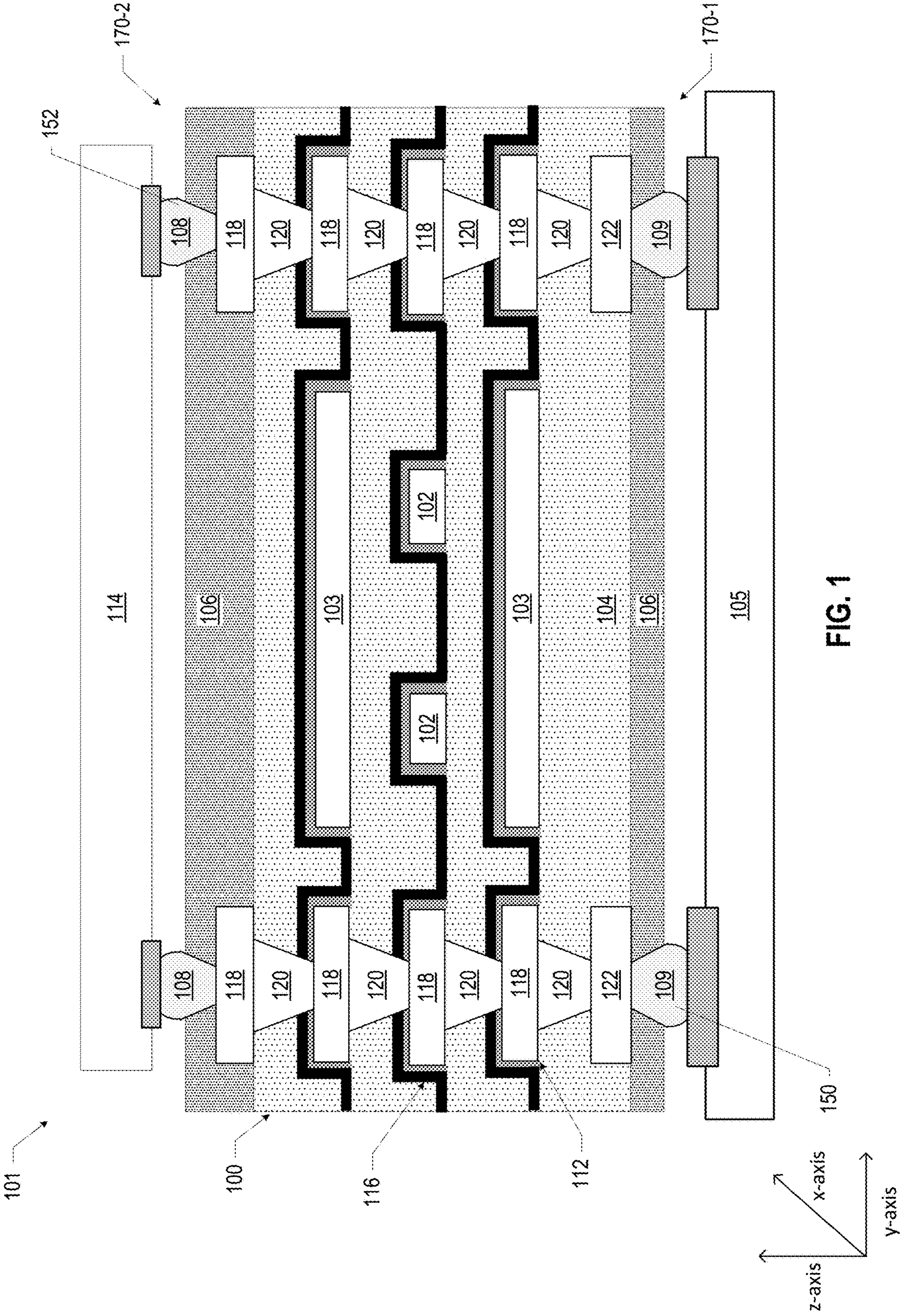
FIG. 1 is a side, cross-sectional view of an example IC package support including a silver liner structure, in accordance with various embodiments.

Disclosed herein are silver-coated conductive structures in integrated circuit (IC) package supports, as well as related methods and devices. For example, in some embodiments, an IC package support (e.g., a package substrate or an interposer) may include a conductive line, a first material layer on a top surface and on side surfaces of the conductive line, the first material layer including silver, and a second material layer on the first material layer, the second material layer including silicon or aluminum, and one or more of nitrogen and oxygen.

Silver may improve the electrical performance of some IC assemblies. For example, using high-speed signal routing enhanced with a silver coating on conductive lines in a package substrate or other IC package support may improve signal delivery performance. On-package high-speed routings today suffer from excessive conductor loss. At high frequencies, current is largely confined to a region closer to the surface of the conductor due to skin effect, which decreases a cross-sectional area for current flow and increases the resistance and loss. As used herein, "high-speed" may refer to electromagnetic signals with a frequency above approximately 20 gigahertz (GHz). Such signals may be signals with a frequency between approximately 20 GHz and approximately 300 GHz, which may also be referred to as "mmWave" signals. Alternatively, such "high-speed" signals may have a higher or lower frequency. For example, a "high-speed" signal may refer to a signal with a frequency as low as a few gigahertz, or a signal with a frequency above 300 GHz. A signal with a frequency higher than approximately 300 GHz may in some embodiments be referred to as a signal in the terahertz (THz)-frequency range. The lower resistance of silver enables the electrical signals to travel with less resistance which allows them to travel further, or be driven with less energy. Further, the silver material on and around the conductive features may be coated with a silicon nitride material, which may promote adhesion to the subsequent dielectric film lamination. The advantage is that the silver layer may have a very smooth outer surface, which along with its lower electrical resistance, attenuates the skin effect such that current flow is increased and resistance and loss are decreased. For example, experiments were performed to determine insertion loss at 56 gigahertz (GHz) for a copper conductive line (i.e., 1.74 decibel (dB) scaled insertion loss), a copper conductive line with a 0.3 micron silver coating (i.e., 1.68 dB scaled insertion loss), and a silver conductive line (i.e., 1.66 dB scaled insertion loss). The results show that insertion loss at 56 GHz (e.g., Nyquist frequency for 224 gigabits per second (Gbps) PAM4) is improved by approximately 3.5 percent in dB scale with the 0.3 micron silver coating. Further increasing a thickness of the silver coating may result in additional reduced insertion loss but with a slower rate of change. An IC package typically includes hundreds or even thousands of signal carrying traces, so significant power savings and product performance improvements may be realized with various ones of the embodiments disclosed herein.

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous. When used to describe a range of dimensions, the phrase "between X and Y" represents a range that includes X and Y.

FIG. 1 is a side, cross-sectional view of an example of microelectronic assembly 101 having an IC package support 100 that includes a silver liner 112. The IC package support 100 may have a first surface 170-1 and an opposing second surface 170-2, and may include a number of conductive pads 118 coupled by conductive vias 120, as well as conductive lines 102 (e.g., extending in and out of the drawings sheet), and conductive planes 103 (e.g., ground planes) distributed through the dielectric material 104. The conductive lines 102, the conductive planes 103, and/or the conductive pads 118 and 122 may be coated with a first material layer 112 on a top surface (e.g., a surface facing the second surface 170-2) and on side surfaces. The first material layer 112 may be any suitable material, including silver. A first material layer 112 may have any suitable dimensions, for example, in some embodiments, a first material layer 112 may have a thickness (e.g., height or z-height) between 50 nanometers and 450 nanometers. The conductive lines 102, the conductive planes 103, and/or the conductive pads 118 and 122 may be further coated with a second material layer 116 on and around the first material layer 112. The second material layer 116 may be any suitable material, including silicon or aluminum and one or more of nitrogen and oxygen. For example, the second material layer 116 may include silicon and nitrogen (e.g., in the form of silicon nitride); silicon, oxygen, and nitrogen (e.g., in the form of silicon oxynitride); aluminum and oxygen (e.g., in the form of aluminum oxide); or aluminum and nitrogen (e.g., in the form of aluminum nitride). In particular embodiments, the second material layer 116 may include silicon and nitrogen having a ratio of silicon to nitrogen of 3 to 4. Depending on the deposition process used, hydrogen and/or oxygen may also be present in second material layer 116 in small quantities. The second material layer 116 may have any suitable dimensions, for example, in some embodiments, a second material layer 116 may have a thickness (e.g., z-height) between 50 nanometers and 450 nanometers. The dielectric material 104 of FIG. 1 may be provided by multiple layers of dielectric material (e.g., including the layers of dielectric material 104-1 and 104-2 discussed below with reference to FIG. 2). The conductive pads 118 and 122, the conductive vias 120, and the conductive lines 102 may provide electrical pathways through the IC package support 100. Conductive lines 102 and one or more conductive planes 103 may be part of a transmission line structure, such as a differential stripline. For example, conductive lines 102 may be differential signal lines and conductive planes 103 may provide a reference against which the signal is based, may serve as a return path for current or signal, or may be electrically coupled to a ground potential to form ground planes. Conductive pads 118 disposed at the second surface 170-2 of the IC package support 100 may serve as conductive contacts to couple the IC package support 100 to a component 114 via first-level interconnects 152 (e.g., solder bumps 108). For example, when the IC package support 100 is a package substrate, the first-level interconnects 152 may be electrically coupled to one or more dies, other active or passive devices, or an interposer. When the IC package support 100 is an interposer, the first-level interconnects 152 may be electrically coupled to one or more dies, other active or passive devices, or another interposer. In some embodiments in which the IC package support 100 is a package substrate, the package substrate may be coreless. A solder resist material 106 may be disposed around the conductive pads 118. Conductive pads 122 disposed at the first surface 170-1 of the IC package support 100 may serve as conductive contacts to couple the IC package support 100 to a component 105 via second-level interconnects 150 (e.g., solder balls 109). For example, when the IC package support 100 is a package substrate, the second-level interconnects 150 may couple the IC package support 100 to a circuit board (e.g., a motherboard). When the IC package support 100 is an interposer, the second-level interconnects 150 may couple the IC package support 100 to another interposer or a package substrate. Although FIG. 1 illustrates a differential stripline structure having two conductive lines 102 and top and bottom ground planes 103, any type of transmission line structure may be used, including, for example, coplanar waveguides, microstrips and other types of striplines, such as skip layer striplines. Further, any type of signaling may be used, including, for example, single-ended, and differential. Although FIG. 1 illustrates a particular number of metallization layers and a particular arrangement of conductive structures, an IC package support 100 may have any suitable number of metallization layers and suitable arrangement of conductive structures (e.g., conductive lines 102, vias 120, planes 103, and pads 118, 122).

As used herein, a "conductive contact" may refer to a portion of conductive material (e.g., metal) serving as an electrical interface between different components (e.g., part of a conductive interconnect); conductive contacts may be recessed in, flush with, or extending away (e.g., having a pillar shape) from a surface of a component, and may take any suitable form (e.g., a conductive pad or socket, or portion of a conductive line or via). In a general sense, an "interconnect" refers to any element that provides a physical connection between two other elements. For example, an electrical interconnect provides electrical connectivity between two electrical components, facilitating communication of electrical signals between them; an optical interconnect provides optical connectivity between two optical components, facilitating communication of optical signals between them. As used herein, both electrical interconnects and optical interconnects are comprised in the term "interconnect." The nature of the interconnect being described is to be understood herein with reference to the signal medium associated therewith. Thus, when used with reference to an electronic device, such as an IC that operates using electrical signals, the term "interconnect" describes any element formed of an electrically conductive material for providing electrical connectivity to one or more elements associated with the IC or/and between various such elements. In such cases, the term "interconnect" may refer to both conductive traces (also sometimes referred to as "metal traces," "lines," "metal lines," "wires," "metal wires," "trenches," or "metal trenches") and conductive vias (also sometimes referred to as "vias" or "metal vias"). Sometimes, electrically conductive traces and vias may be referred to as "conductive traces" and "conductive vias", respectively, to highlight the fact that these elements include electrically conductive materials such as metals. Likewise, when used with reference to a device that operates on optical signals as well, such as a photonic IC (PIC), "interconnect" may also describe any element formed of a material that is optically conductive for providing optical connectivity to one or more elements associated with the PIC. In such cases, the term "interconnect" may refer to optical waveguides (e.g., structures that guide and confine light waves), including optical fiber, optical splitters, optical combiners, optical couplers, and optical vias.

The IC package support 100 of FIG. 1 may be manufactured in accordance with any suitable technique. For example, FIGS. 2-9 illustrate stages in an example process of manufacturing the IC package support 100 of FIG. 1, in accordance with various embodiments. Although the operations of FIGS. 2-9 may be illustrated with reference to a particular embodiment of the IC package support 100 and first and second material layers 112, 116, disclosed herein, the method may be used to form any suitable IC package supports 100 and/or first and second material layers 112, 116. Operations are illustrated once each and in a particular order in FIGS. 2-9, but the operations may be reordered and/or repeated as desired (e.g., with different operations performed in parallel when manufacturing multiple IC package supports 100 simultaneously).

Figure 2:
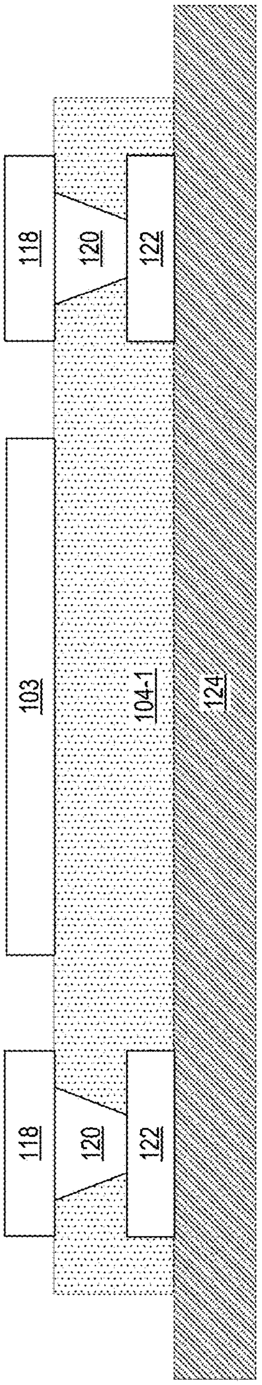
FIGS. 2-9 illustrate stages in an example process of manufacturing the IC package support of FIG. 1, in accordance with various embodiments.

FIG. 2 illustrates an assembly including a carrier 124 on which a portion of an IC package support has been formed. The portion of IC package support may include conductive pads 118, 122 and conductive vias 120 in a layer of dielectric material 104-1. The portion of IC package support may be formed using any suitable process. For example, conductive pads 122 may be formed using a lithographic process of patterning photoresist to form openings and an electroplating process to deposit a conductive material in the openings to form conductive pads 122. A lamination process may be used to deposit a layer of dielectric material 104-1 on and over the conductive pads 122. A laser drilling process may be used to form via openings to the conductive pads and an electroplating process may be used to deposit a conductive material into the openings to form conductive vias 120. The lithographic and electroplating processes may be repeated to form conductive pads 118. The carrier 124 may include any suitable material for performing subsequent manufacturing operations, and providing mechanical stability during subsequent manufacturing operations (e.g., silicon, glass, ceramic, materials having a coefficient of thermal expansion similar to the components that will be positioned on the carrier 124, etc.). The photoresist may be initially deposited on the carrier 124 using any suitable technique (e.g., lamination or spin-on deposition), and the photoresist may be patterned using any suitable lithographic technique (e.g., exposing the photoresist with a mask to change the solubility of different portions of the photoresist and then etching away the more soluble portions, as known in the art). Conductive material may be electrolytically plated in the openings on the surface of the carrier 124 to a desired thickness. The conductive material may have any suitable material composition; for example, the conductive material may be copper. The layer of dielectric material 104-1 may be formed using any suitable technique (e.g., lamination). A thickness of the layer of dielectric material 104-1 may be selected to have any suitable value. For example, a thickness of the layer of dielectric material 104-1, and of the other layers of dielectric material 104, may be between 25 microns and 75 microns (e.g., between 25 microns and 35 microns, or between 55 microns and 75 microns). A thickness of a layer of dielectric material may depend on the type of transmission line structure. The dielectric materials 104 disclosed herein may include any suitable dielectric materials. For example, a dielectric material 104 may be a buildup film (e.g., an organic, polymer-based dielectric film). The via opening may be formed using any suitable technique, including laser drilling (e.g., laser skiving), and a conductive material may be deposited therein, for example, using an electroplating process. The via opening may be tapered, narrowing from the top surface of the layer of dielectric material 104-1 toward the conductive pad 122. In some embodiments, a desmear operation may be performed after forming the via opening before depositing the conductive material. In some embodiments in which the layer of dielectric material 104-1 is a photoimageable dielectric, the via opening may be formed by selectively exposing and developing the layer of dielectric material 104-1, instead of laser drilling, as known in the art. A conductive pad 118 may be formed on the conductive via 120 and a conductive plane 103 may be formed using any suitable techniques. For example, in a semi-additive process, a seed layer may be formed on the top surface of the layer of dielectric material 104-1, a photoresist may be deposited and patterned to expose the seed layer on the top surface of the layer of dielectric material 104-1, conductive material (e.g., copper) may be electroplated on the seed layer, the photoresist may be stripped, and a brief seed etch may be performed, resulting in the conductive pad 118 and the conductive plane 103. In some embodiments, the conductive pad 118 may have a same thickness as a thickness of the conductive ground plane 103. In some embodiments, the conductive pad 118 may have a greater thickness than a thickness of the conductive ground plane 103.

Figure 3:
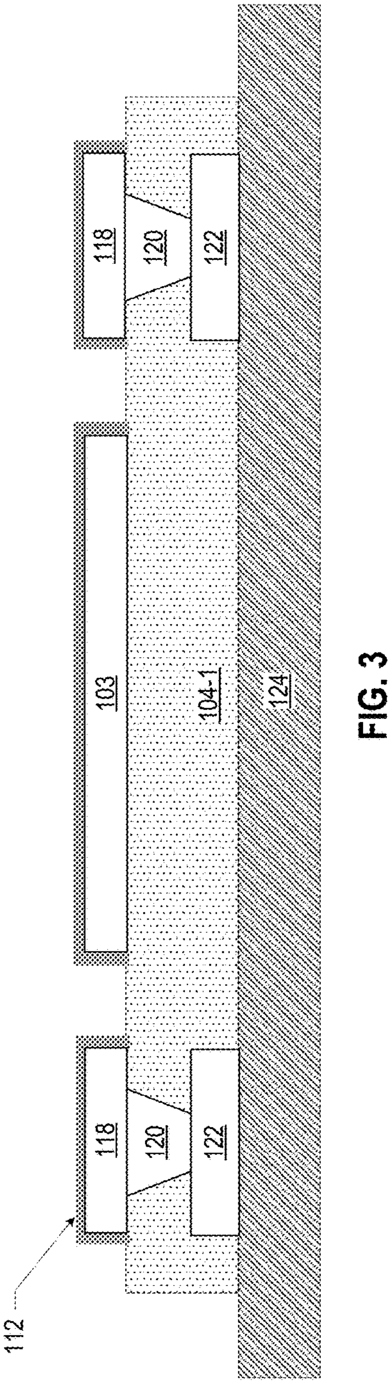

FIG. 3 illustrates an assembly subsequent to forming a layer of silver material 112 on and around the conductive pads 118 and the conductive plane 103 of the assembly of FIG. 2. The layer of silver material 112 may be selectively deposited on the top and side surfaces of the conductive pads 118 and the conductive ground plane 103 using any suitable process, for example, an immersion silver coating process. In some embodiments, the layer of silver material 112 may not be deposited on the conductive pads 118 and/or the conductive ground plane 103, and instead may be omitted. The layer of silver material 112 may have any suitable dimensions, for example, a thickness of the layer of silver material 112 may be between 50 nanometers and 450 nanometers.

Figure 4:
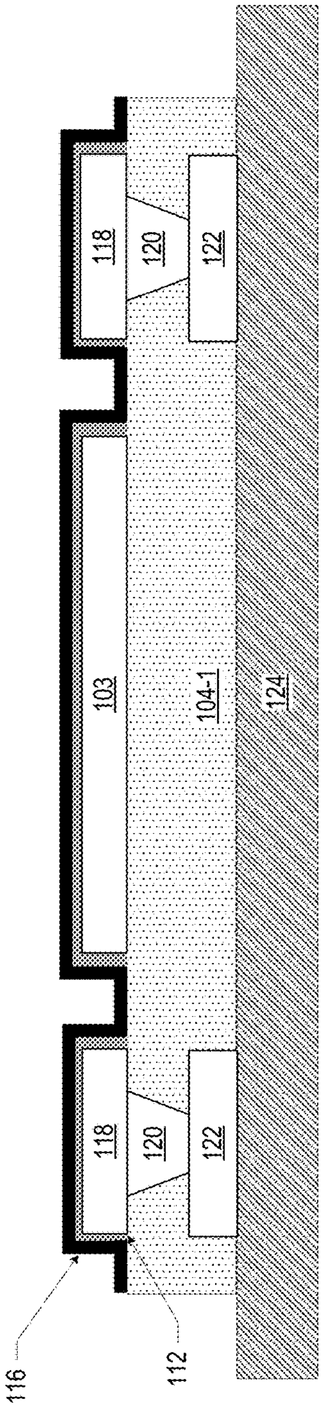

FIG. 4 illustrates an assembly subsequent to forming a layer of material 116 including silicon or aluminum, and one or more of nitrogen and oxygen, on a top surface of the assembly of FIG. 2. The layer of material 116 including silicon or aluminum, and one or more of nitrogen and oxygen, may be deposited using any suitable process, for example, a vacuum-based thin film deposition process, such as plasma enhanced chemical vapor deposition (PECVD) or sputtering. The layer of material 116 including silicon or aluminum, and one or more of nitrogen and oxygen, may be deposited on the layer of dielectric material 104-1 and on and over the layer of silver material 112. The layer of material 116 including silicon or aluminum, and one or more of nitrogen and oxygen, may have any suitable dimensions, for example, a thickness of the layer of material 116 including silicon or aluminum, and one or more of nitrogen and oxygen, may be between 50 nanometers and 450 nanometers. In some embodiments, a thickness of the layer of silver material 112 and the layer of material 116 including silicon or aluminum, and one or more of nitrogen and oxygen, may be between 100 nanometers and 900 nanometers.

Figure 5:
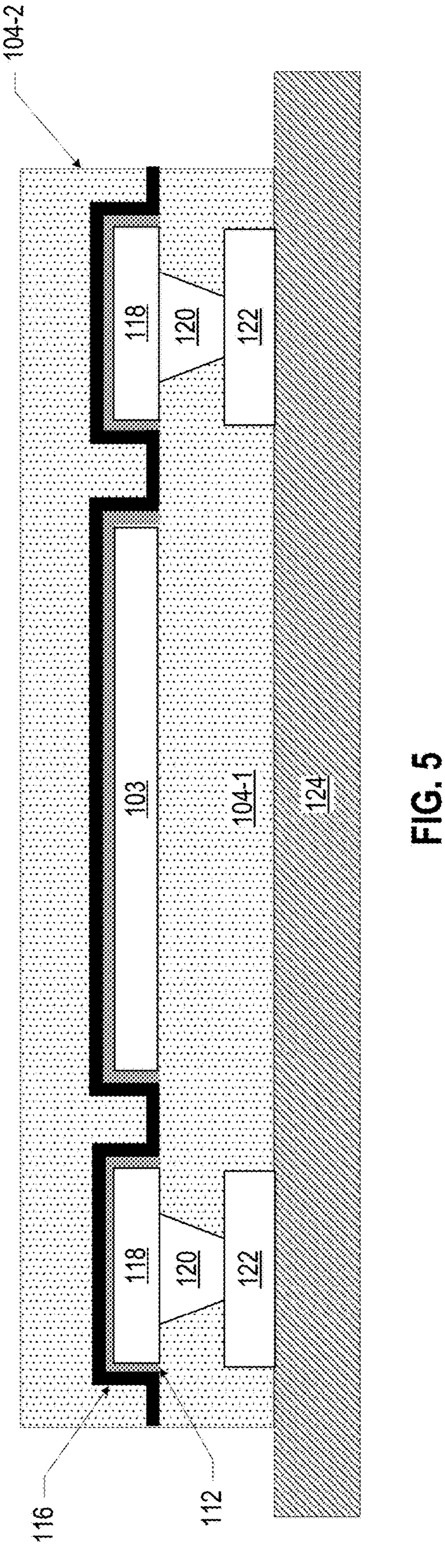

FIG. 5 illustrates an assembly subsequent to forming a layer of dielectric material 104-2 on the top surface of the assembly of FIG. 4. The layer of dielectric material 104-2 may extend over the layer of dielectric material 104-1 and layer of material 116 including silicon or aluminum, and one or more of nitrogen and oxygen. The layer of dielectric material 104-2 may have any suitable thickness, as described above with reference to FIG. 1. The layer of dielectric material 104-2 may be deposited using any suitable technique (e.g., lamination). The thickness of the layer of dielectric material 104-2 may be a same thickness other layers of dielectric material 104 in the IC package support 100.

Figure 6:
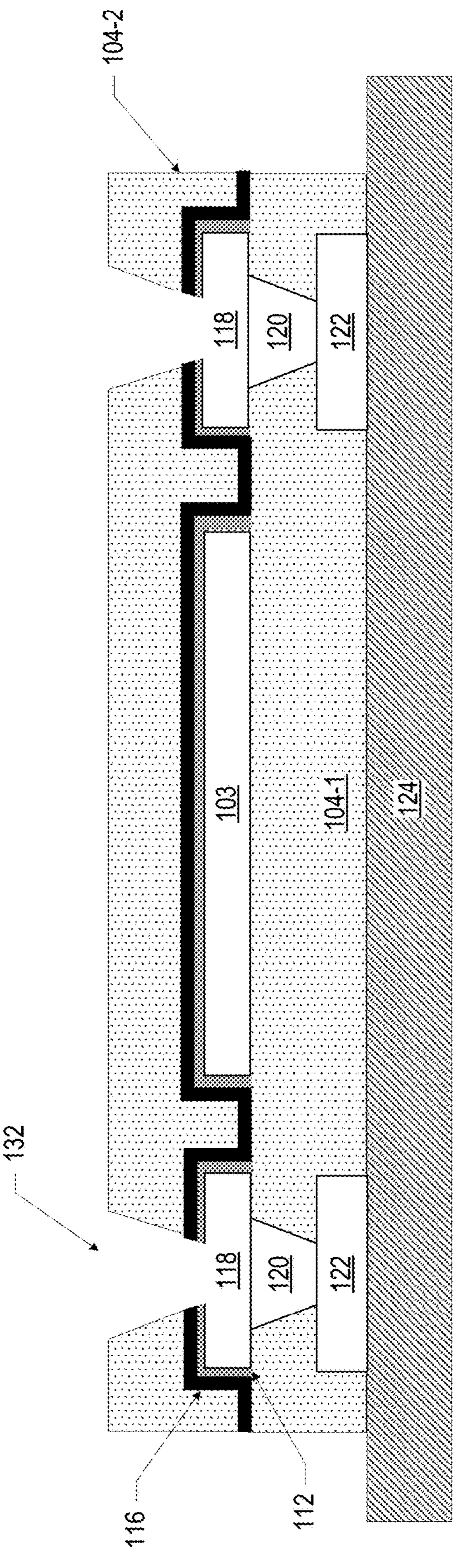

FIG. 6 illustrates an assembly subsequent to forming via openings 132 through the layer of dielectric material 104-2, the layer of material 116 including silicon or aluminum, and one or more of nitrogen and oxygen, and the layer of silver material 112 to expose a portion of the top surface of the conductive pad 118 of the assembly of FIG. 5. Any suitable technique may be used to form the via openings 132. For example, the via openings 132 may be formed by laser drilling (e.g., laser skiving), with the top surface of the respective conductive pads 118 serving as a laser stop. The via openings 132 may be tapered, narrowing from the top surface of the layer of dielectric material 104-2 to the conductive pad 118. In some embodiments in which the layer of dielectric material 104-2 is a photoimageable dielectric, the via openings 132 may be formed by selectively exposing and developing the layer of dielectric material 104-2, instead of laser drilling, as known in the art. In some embodiments, a desmear or a dry/plasma-based etch operation may be performed after forming the via openings 132.

Figure 7:
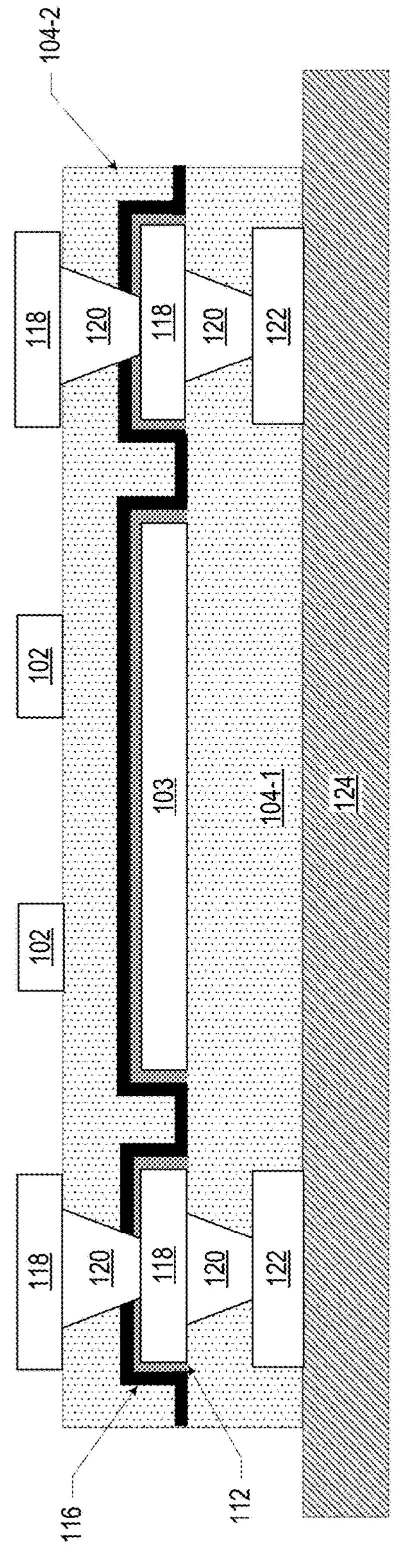

FIG. 7 illustrates an assembly subsequent to forming a conductive via 120 in the via opening 132 of the assembly of FIG. 6, and also forming a conductive pad 118 on the conductive via 120 and forming conductive lines 102. The conductive vias 120, the conductive pads 118, and the conductive lines 102 may be formed by depositing a conductive material using any suitable techniques. For example, in a semi-additive process, a seed layer may be formed over the assembly of FIG. 6, a photoresist may be deposited and patterned to expose the seed layer in the via openings 132 and a portion of the area on the top surface of the layer of dielectric material 104-2, conductive material (e.g., copper) may be electroplated on the seed layer, the photoresist may be stripped, and a brief seed etch may be performed, resulting in the conductive vias 120, the conductive pads 118, and the conductive lines 102. The conductive material may have any suitable material composition; for example, the conductive material may be copper. The conductive lines 102 may have a same thickness as the thickness of the conductive pads 118. For example, in some embodiments, a thickness of the conductive line and a thickness of the conductive pad is between 10 microns and 50 microns. In some embodiments, conductive lines 102 may have a same thickness as a thickness of the conductive pads 118. For example, in some embodiments, a thickness of the conductive line is between 10 microns and 20 microns and the thickness of the conductive pad 118, 122 is between 10 microns and 20 microns. In some embodiments, conductive lines 102 may have a smaller thickness than the thickness of the conductive pads 118. For example, in some embodiments, a thickness of the conductive line is between 10 microns and 20 microns and the thickness of the conductive pad 118, 122 may be between 20 microns and 50 microns. Utilizing a thicker conductive pad 118, 122 may reduce the thickness (and aspect ratio) of a conductive via 120 that will extend through the layer of dielectric material 104 to make conductive contact with the conductive pad 118, 122, improving manufacturability and reliability.

Figure 8:
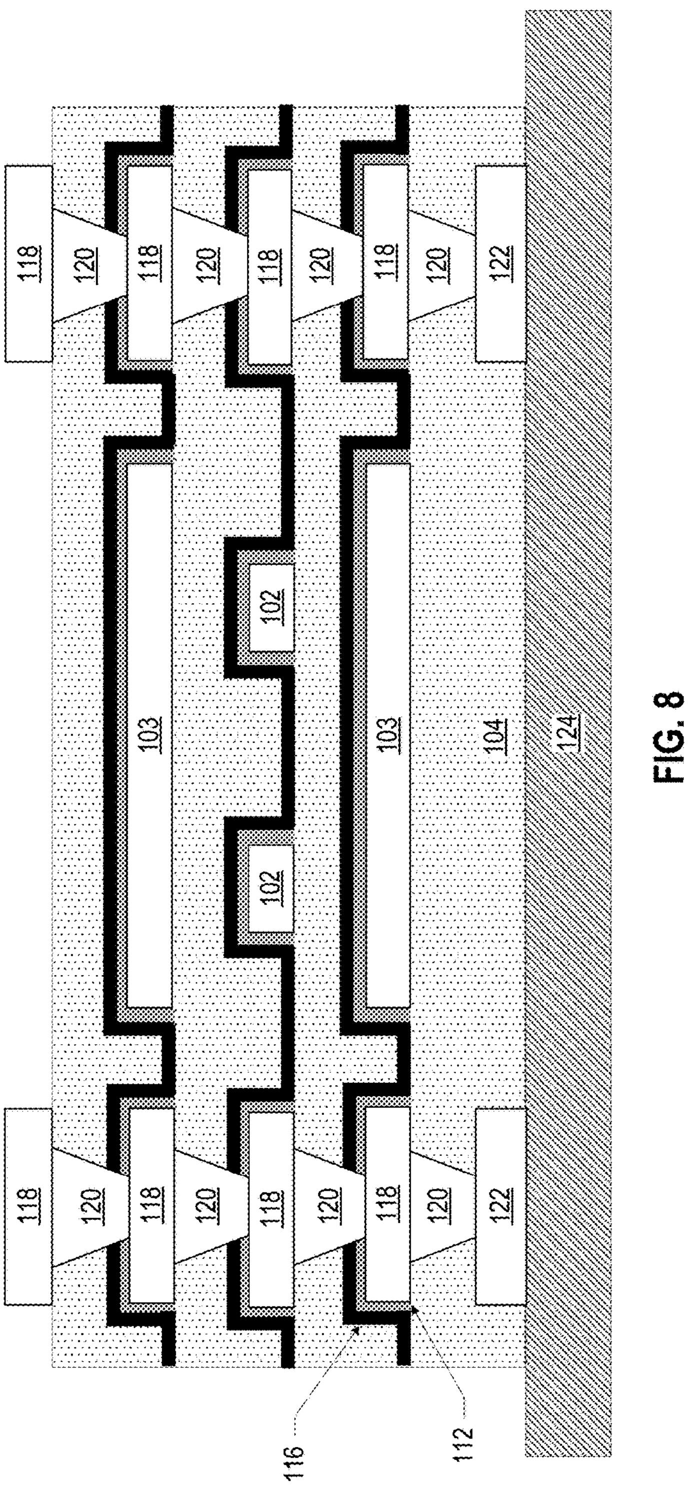

FIG. 8 illustrates an assembly subsequent to repeating the processes of FIGS. 3-7 to form additional layers and conductive structures to complete the IC package support 100 of FIG. 1.

Figure 9:
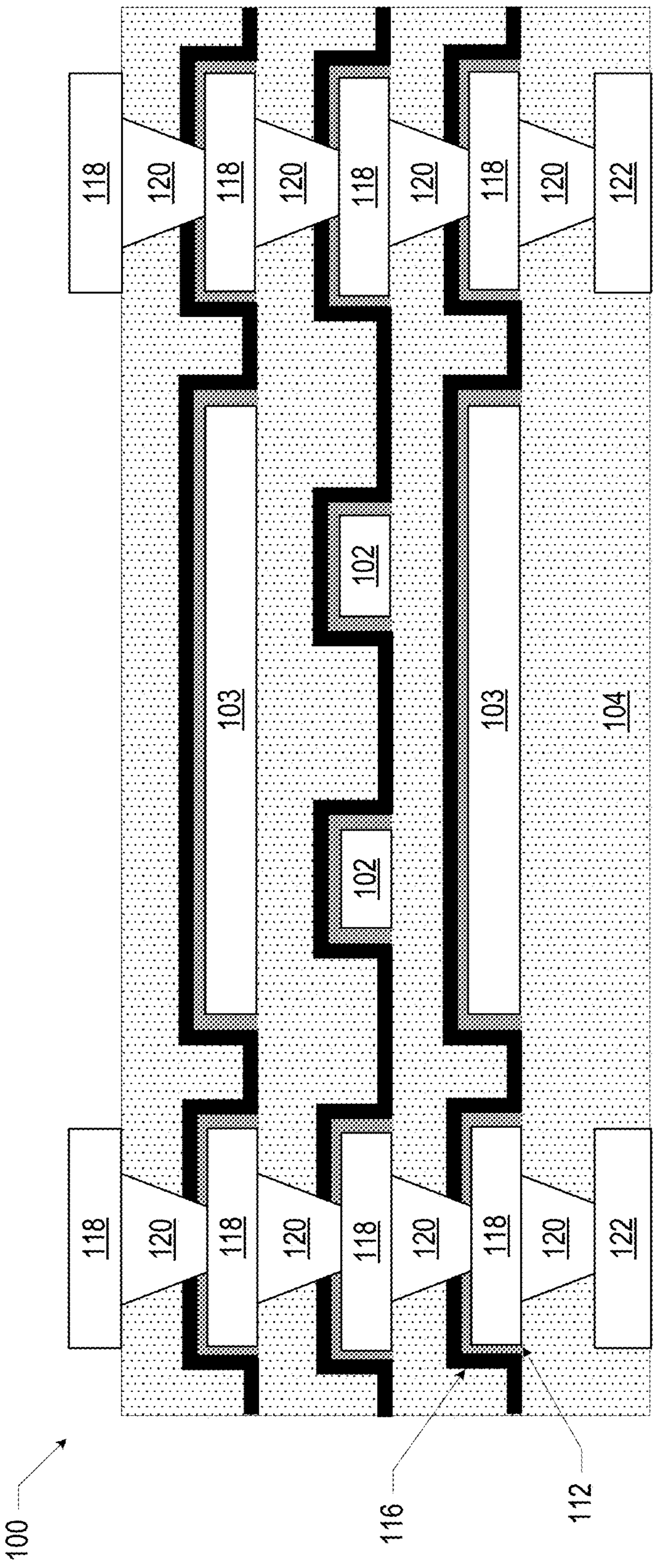

FIG. 9 illustrates an assembly subsequent to removing the carrier 124. The assembly of FIG. 9 may itself be an IC package support 100, as shown. Further manufacturing operations may be performed on the IC package support 100 of FIG. 9 to form other microelectronic assemblies; for example, solder resist 106, solder 108, 109 may be deposited on conductive pads 118, 122, respectively, and may be used to couple the IC package support 100 of FIG. 9 to a component 114 via first level interconnects 152 and to a component 105 via second level interconnects 150, respectively, similar to the microelectronic assembly 101 of FIG. 1.

The IC package supports 100 disclosed herein may be included in any suitable electronic component. FIGS. 10-14 illustrate various examples of apparatuses that may include any of the IC package supports 100 disclosed herein, or may be included in an IC package that also includes any of the IC package supports 100 disclosed herein.

Figure 10:
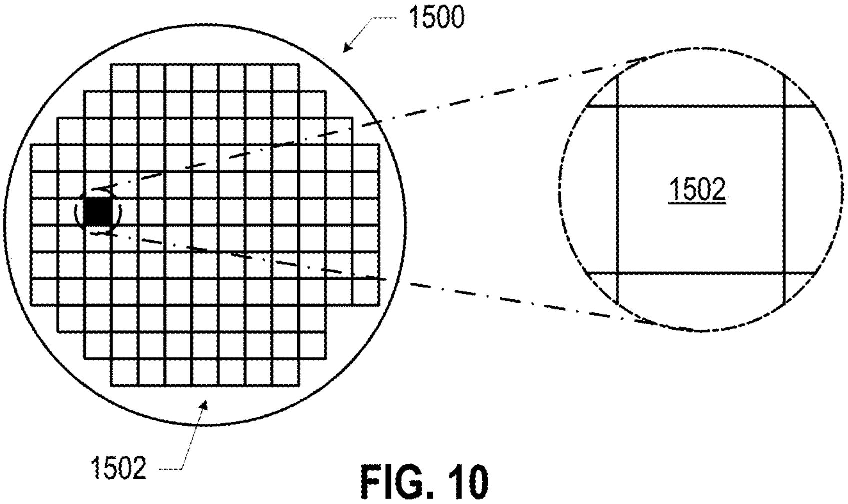
FIG. 10 is a top view of a wafer and dies that may be included in an IC package having an IC package support in accordance with any of the embodiments disclosed herein.

FIG. 10 is a top view of a wafer 1500 and dies 1502 that may be included in an IC package including one or more IC package supports 100 in accordance with any of the embodiments disclosed herein. The wafer 1500 may be composed of semiconductor material and may include one or more dies 1502 having IC structures formed on a surface of the wafer 1500. Each of the dies 1502 may be a repeating unit of a semiconductor product that includes any suitable IC. After the fabrication of the semiconductor product is complete, the wafer 1500 may undergo a singulation process in which the dies 1502 are separated from one another to provide discrete "chips" of the semiconductor product. The die 1502 may include one or more transistors (e.g., some of the transistors 1640 of FIG. 11, discussed below) and/or supporting circuitry to route electrical signals to the transistors, as well as any other IC components. In some embodiments, the wafer 1500 or the die 1502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 13) or other logic that is configured to store information in the memory devices or execute instructions stored in the memory array.

Figure 11:
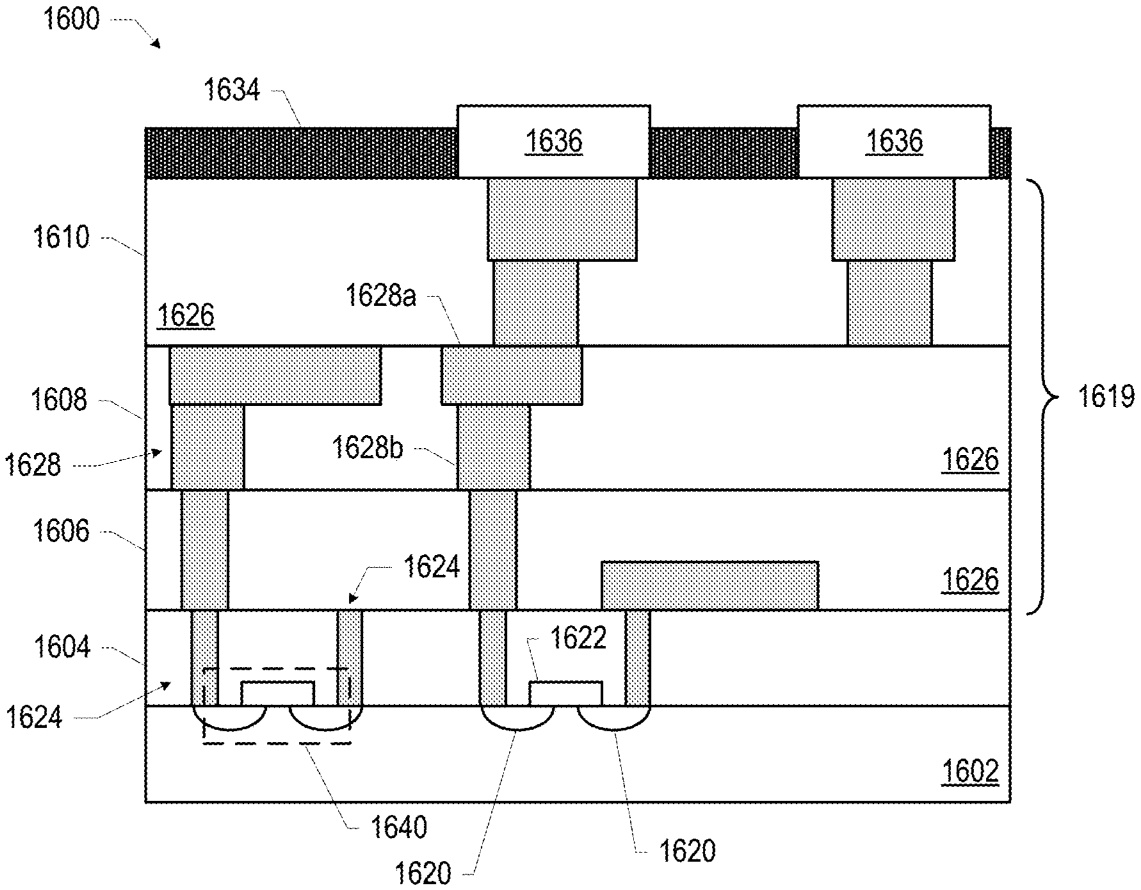
FIG. 11 is a side, cross-sectional view of an IC device that may be included in an IC package having an IC package support in accordance with any of the embodiments disclosed herein.

FIG. 11 is a side, cross-sectional view of an IC device 1600 that may be included in an IC package including one or more IC package supports 100, in accordance with any of the embodiments disclosed herein. One or more of the IC devices 1600 may be included in one or more dies 1502 (FIG. 10). The IC device 1600 may be formed on a substrate 1602 (e.g., the wafer 1500 of FIG. 10) and may be included in a die (e.g., the die 1502 of FIG. 10). The substrate 1602 may be a semiconductor substrate composed of semiconductor material systems including, for example, n-type or p-type materials systems (or a combination of both). The substrate 1602 may include, for example, a crystalline substrate formed using a bulk silicon or a silicon-on-insulator (SOI) substructure. In some embodiments, the substrate 1602 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 1602. Although a few examples of materials from which the substrate 1602 may be formed are described here, any material that may serve as a foundation for an IC device 1600 may be used. The substrate 1602 may be part of a singulated die (e.g., the dies 1502 of FIG. or a wafer (e.g., the wafer 1500 of FIG. 10).

The IC device 1600 may include one or more device layers 1604 disposed on the substrate 1602. The device layer 1604 may include features of one or more transistors 1640 (e.g., metal oxide semiconductor field-effect transistors (MOSFETs)) formed on the substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 11 and may include a wide variety of other types and configurations such as, for example, planar transistors, non-planar transistors, or a combination of both. Planar transistors may include bipolar junction transistors (BJT), heterojunction bipolar transistors (HBT), or high-electron-mobility transistors (HEMT). Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1640 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1640 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1620 may be formed within the substrate 1602 adjacent to the gate 1622 of each transistor 1640. The S/D regions 1620 may be formed using an implantation/diffusion process or an 164/deposition process, for example. In the former process, dopants such as boron, aluminum, antimony, phosphorous, or arsenic may be ion-implanted into the substrate 1602 to form the S/D regions 1620. An annealing process that activates the dopants and causes them to diffuse farther into the substrate 1602 may follow the ion-implantation process. In the latter process, the substrate 1602 may first be etched to form cavities at the locations of the S/D regions 1620. An epitaxial deposition process may then be carried out to fill the cavities with material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620.

Electrical signals, such as power and/or input/output (I/O) signals, may be routed to and/or from the devices (e.g., the transistors 1640) of the device layer 1604 through one or more interconnect layers disposed on the device layer 1604 (illustrated in FIG. 11 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form a metallization stack (also referred to as an "ILD stack") 1619 of the IC device 1600.

The interconnect structures 1628 may be arranged within the interconnect layers 1606-1610 to route electrical signals according to a wide variety of designs (in particular, the arrangement is not limited to the particular configuration of interconnect structures 1628 depicted in FIG. 11). Although a particular number of interconnect layers 1606-1610 is depicted in FIG. 11, embodiments of the present disclosure include IC devices having more or fewer interconnect layers than depicted.

In some embodiments, the interconnect structures 1628 may include lines 1628*a* and/or vias 1628*b* filled with an electrically conductive material such as a metal. The lines 1628*a* may be arranged to route electrical signals in a direction of a plane that is substantially parallel with a surface of the substrate 1602 upon which the device layer 1604 is formed. For example, the lines 1628*a* may route electrical signals in a direction in and out of the page from the perspective of FIG. 11. The vias 1628*b* may be arranged to route electrical signals in a direction of a plane that is substantially perpendicular to the surface of the substrate 1602 upon which the device layer 1604 is formed. In some embodiments, the vias 1628*b* may electrically couple lines 1628*a* of different interconnect layers 1606-1610 together.

The interconnect layers 1606-1610 may include a dielectric material 1626 disposed between the interconnect structures 1628, as shown in FIG. 11. In some embodiments, the dielectric material 1626 disposed between the interconnect structures 1628 in different ones of the interconnect layers 1606-1610 may have different compositions; in other embodiments, the composition of the dielectric material 1626 between different interconnect layers 1606-1610 may be the same.

A first interconnect layer 1606 may be formed above the device layer 1604. In some embodiments, the first interconnect layer 1606 may include lines 1628*a* and/or vias 1628*b*, as shown. The lines 1628*a* of the first interconnect layer 1606 may be coupled with contacts (e.g., the S/D contacts 1624) of the device layer 1604.

A second interconnect layer 1608 may be formed above the first interconnect layer 1606. In some embodiments, the second interconnect layer 1608 may include vias 1628*b* to couple the lines 1628*a* of the second interconnect layer 1608 with the lines 1628*a* of the first interconnect layer 1606. Although the lines 1628*a* and the vias 1628*b* are structurally delineated with a line within each interconnect layer (e.g., within the second interconnect layer 1608) for the sake of clarity, the lines 1628*a* and the vias 1628*b* may be structurally and/or materially contiguous (e.g., simultaneously filled during a dual-damascene process) in some embodiments.

A third interconnect layer 1610 (and additional interconnect layers, as desired) may be formed in succession on the second interconnect layer 1608 according to similar techniques and configurations described in connection with the second interconnect layer 1608 or the first interconnect layer 1606. In some embodiments, the interconnect layers that are "higher up" in the metallization stack 1619 in the IC device 1600 (i.e., farther away from the device layer 1604) may be thicker.

The IC device 1600 may include a solder resist material 1634 (e.g., polyimide or similar material) and one or more conductive contacts 1636 formed on the interconnect layers 1606-1610. In FIG. 11, the conductive contacts 1636 are illustrated as taking the form of bond pads. The conductive contacts 1636 may be electrically coupled with the interconnect structures 1628 and configured to route the electrical signals of the transistor(s) 1640 to other external devices. For example, solder bonds may be formed on the one or more conductive contacts 1636 to mechanically and/or electrically couple a chip including the IC device 1600 with another component (e.g., a circuit board). The IC device 1600 may include additional or alternate structures to route the electrical signals from the interconnect layers 1606-1610; for example, the conductive contacts 1636 may include other analogous features (e.g., posts) that route the electrical signals to external components.

Figure 12:
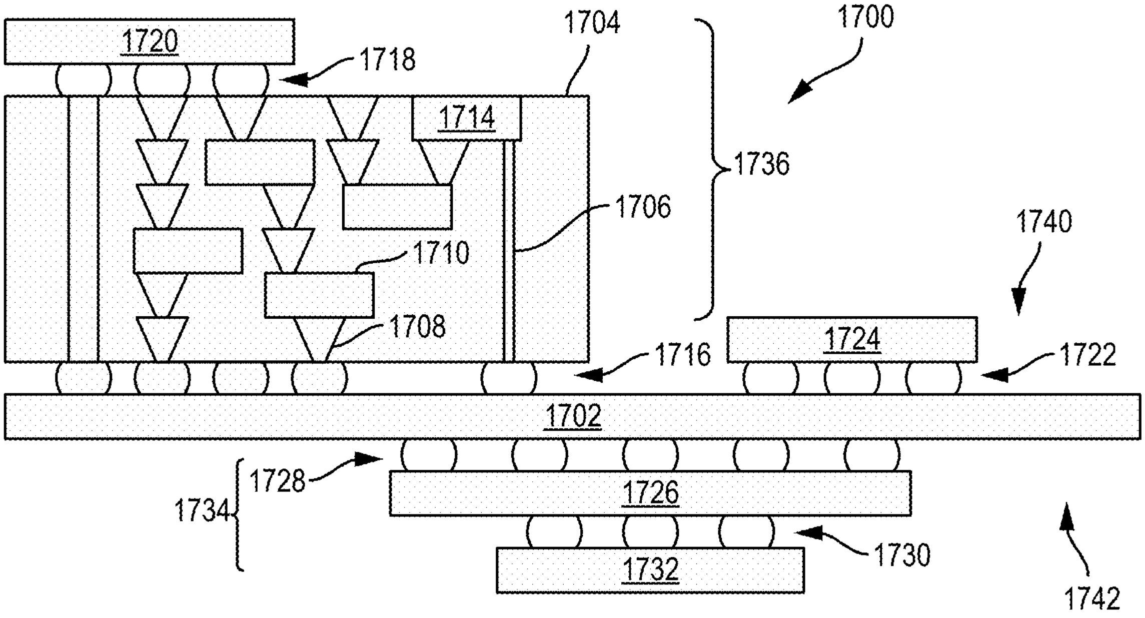
FIG. 12 is a side, cross-sectional view of an IC device assembly that may include an IC package support in accordance with any of the embodiments disclosed herein.

FIG. 12 is a side, cross-sectional view of an IC device assembly 1700 that may include one or more IC package supports 100, in accordance with any of the embodiments disclosed herein. The IC device assembly 1700 includes a number of components disposed on a circuit board 1702 (which may be, e.g., a motherboard). The IC device assembly 1700 includes components disposed on a first surface 1740 of the circuit board 1702 and an opposing second surface 1742 of the circuit board 1702; generally, components may be disposed on one or both surfaces 1740 and 1742.

In some embodiments, the circuit board 1702 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 12 includes a package-on-interposer structure 1736 coupled to the first surface 1740 of the circuit board 1702 by coupling components 1716. The coupling components 1716 may electrically and mechanically couple the package-on-interposer structure 1736 to the circuit board 1702, and may include solder balls (as shown in FIG. 12), male and female portions of a socket, an adhesive, an underfill material, and/or any other suitable electrical and/or mechanical coupling structure.

The package-on-interposer structure 1736 may include an IC package 1720 coupled to a package interposer 1704 by coupling components 1718. The coupling components 1718 may take any suitable form for the application, such as the forms discussed above with reference to the coupling components 1716. Although a single IC package 1720 is shown in FIG. 12, multiple IC packages may be coupled to the package interposer 1704; indeed, additional interposers may be coupled to the package interposer 1704. The package interposer 1704 may provide an intervening substrate used to bridge the circuit board 1702 and the IC package 1720. The IC package 1720 may be or include, for example, a die (the die 1502 of FIG. 10), an IC device (e.g., the IC device 1600 of FIG. 11), or any other suitable component. Generally, the package interposer 1704 may spread a connection to a wider pitch or reroute a connection to a different connection. For example, the package interposer 1704 may couple the IC package 1720 (e.g., a die) to a set of BGA conductive contacts of the coupling components 1716 for coupling to the circuit board 1702. In the embodiment illustrated in FIG. 12, the IC package 1720 and the circuit board 1702 are attached to opposing sides of the package interposer 1704; in other embodiments, the IC package 1720 and the circuit board 1702 may be attached to a same side of the package interposer 1704. In some embodiments, three or more components may be interconnected by way of the package interposer 1704.

In some embodiments, the package interposer 1704 may be formed as a PCB, including multiple metal layers separated from one another by layers of dielectric material and interconnected by electrically conductive vias. In some embodiments, the package interposer 1704 may be formed of an epoxy resin, a fiberglass-reinforced epoxy resin, an epoxy resin with inorganic fillers, a ceramic material, or a polymer material such as polyimide. In some embodiments, the package interposer 1704 may be formed of alternate rigid or flexible materials that may include the same materials described above for use in a semiconductor substrate, such as silicon, germanium, and other group III-V and group IV materials. The package interposer 1704 may include metal interconnects 1708 and vias 1710, including but not limited to through-silicon vias (TSVs) 1706. The package interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the package interposer 1704. The package-on-interposer structure 1736 may take the form of any of the package-on-interposer structures known in the art.

The IC device assembly 1700 may include an IC package 1724 coupled to the first surface 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 12 includes a package-on-package structure 1734 coupled to the second surface 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 13:
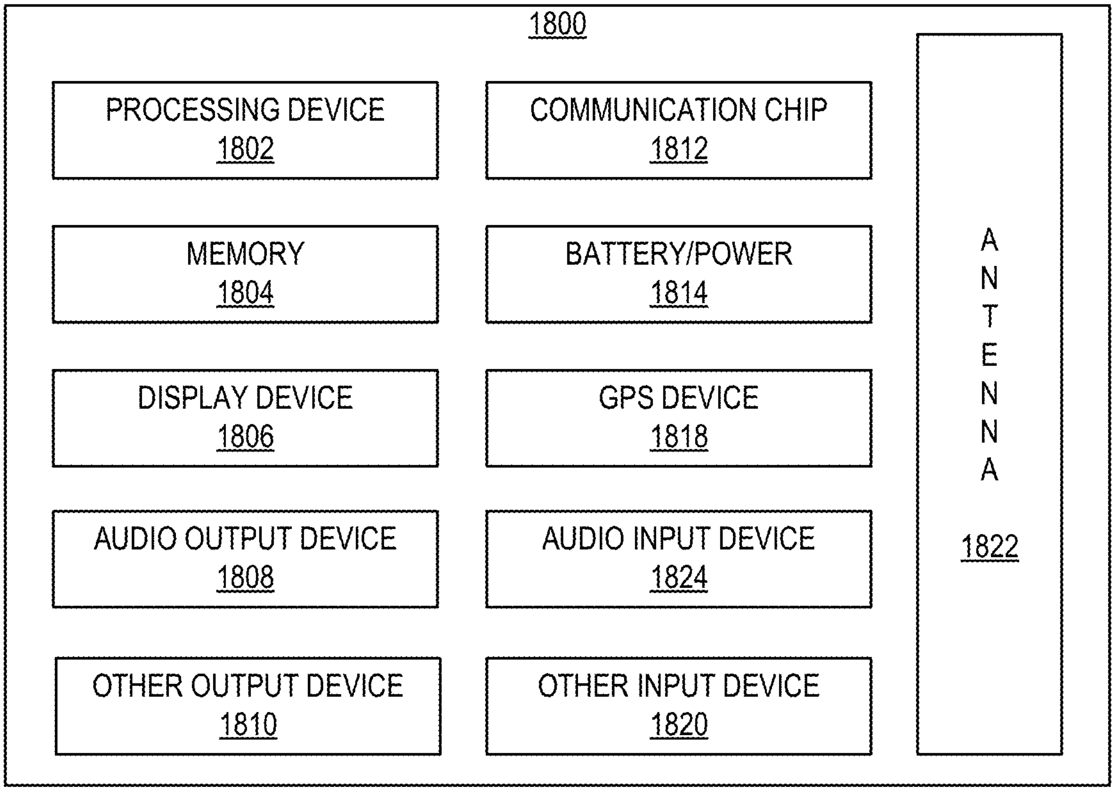
FIG. 13 is a block diagram of an example electrical device that may include an IC package support in accordance with any of the embodiments disclosed herein.

FIG. 13 is a block diagram of an example electrical device 1800 that may include one or more IC package supports 100, in accordance with any of the embodiments disclosed herein. Any suitable ones of the components of the electrical device 1800 may include one or more of the IC device assemblies 1700, IC packages 1650, IC devices 1600, or dies 1502 disclosed herein. A number of components are illustrated in FIG. 13 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 13, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-MRAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UM B) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

Example 1 is an integrated circuit (IC) package support, including a conductive line, a first material layer on a top surface and on side surfaces of the conductive line, the first material layer including silver, and a second material layer on the first material layer, the second material layer including silicon or aluminum, and one or more of nitrogen and oxygen.

Example 2 may include the subject matter of Example 1, and may further specify that the first material layer has a thickness between 50 nanometers and 450 nanometers.

Example 3 may include the subject matter of Example 1 or 2, and may further specify that the second material layer has a thickness between 50 nanometers and 450 nanometers.

Example 4 may include the subject matter of any of Examples 1-3, and may further specify that the conductive line has a thickness between 10 microns and 20 microns.

Example 5 may include the subject matter of any of Examples 1-4, and may further specify that the second material layer includes silicon and nitrogen having a ratio of silicon to nitrogen of 3 to 4.

Example 6 may include the subject matter of any of Examples 1-5, and may further specify that the conductive line is a first conductive line, and the IC package support further includes a second conductive line, wherein the first material layer is on a top surface and on side surfaces of the second conductive line and the second material layer is on the first material layer.

Example 7 may include the subject matter of Example 6, and may further specify that the IC package support further includes a first layer of dielectric material; a first conductive plane embedded in the first layer of dielectric material, wherein the first material layer is on a top surface and on side surfaces of the first conductive plane and the second material layer is on the first material layer; a second layer of dielectric material on the first layer of dielectric material, the first and second conductive lines embedded in the second layer of dielectric material; a third layer of dielectric material on the second layer of dielectric material; and a second conductive plane embedded in the third layer of dielectric material, wherein the first material layer is on a top surface and on side surfaces of the second conductive plane and the second material layer is on the first material layer.

Example 8 may include the subject matter of Example 7, and may further specify that the IC package support further includes a first conductive pad embedded in the first layer of dielectric material, wherein the first material layer is on a top surface and on side surfaces of the first conductive pad and the second material layer is on the first material layer; a second conductive pad embedded in the second layer of dielectric material, wherein the first material layer is on a top surface and on side surfaces of the second conductive pad and the second material layer is on the first material layer; and a conductive via between the first and second conductive pads, wherein the conductive via extends through the first and second material layers on the top surface of the first conductive pad.

Example 9 may include the subject matter of any of Examples 1-8, and may further specify that the IC package support is a package substrate or an interposer.

Example 10 is an electronic assembly, including an integrated circuit (IC) package support, with a conductive structure in a layer of dielectric material, the conductive structure having a first material layer on a top surface and on side surfaces of the conductive structure and a second material layer on the first material layer, wherein the first material layer includes silver and the second material layer includes silicon or aluminum, and one or more of nitrogen and oxygen.

Example 11 may include the subject matter of Example 10, and may further specify that the first material layer has a thickness between 50 nanometers and 450 nanometers.

Example 12 may include the subject matter of Example 10 or 11, and may further specify that the second material layer has a thickness between 50 nanometers and 450 nanometers.

Example 13 may include the subject matter of any of Examples 10-12, and may further specify that the conductive structure is a conductive line in a transmission line structure.

Example 14 may include the subject matter of Example 13, and may further specify that the transmission line structure further includes a first conductive plane below the conductive line and a second conductive plane above the conductive line.

Example 15 may include the subject matter of any of Examples 10-14, and may further specify that the IC package support further includes conductive contacts and the electronic assembly further includes one or more dies coupled to the conductive contacts.

Example 16 may include the subject matter of any of Examples 10-15, and may further specify that the IC package support is included in an IC package, the electronic assembly further includes a circuit board, and the IC package is coupled to the circuit board.

Example 17 is a method of manufacturing an integrated circuit (IC) package support, including forming a conductive line; forming a first layer of material on a top surface and on side surfaces of the conductive line, wherein the first layer of material includes silver; forming a second layer of material on the first layer of material, wherein the second layer of material includes silicon or aluminum, and one or more of nitrogen and oxygen; and forming a layer of dielectric material on the second layer of material, wherein the conductive line is embedded in the layer of dielectric material.

Example 18 may include the subject matter of Example 17, and may further specify that the first layer of material has a thickness between 50 nanometers and 450 nanometers.

Example 19 may include the subject matter of Example 17 or 18, and may further specify that the second layer of material has a thickness between 50 nanometers and 450 nanometers.

Example 20 may include the subject matter of any of Examples 17-19, and may further specify that the layer of dielectric material includes an organic, polymer-based film.

The invention claimed is:

1. An integrated circuit (IC) package support, comprising:

a conductive line, a first material layer on and in contact with a top surface and side surfaces of the conductive line, the first material layer including silver, and a second material layer on and in contact with the first material layer on the top surface and side surfaces of the conductive line, the second material layer including silicon or aluminum, and one or more of nitrogen and oxygen.

2. The IC package support of claim 1, wherein the first material layer has a thickness between 50 nanometers and 450 nanometers.

3. The IC package support of claim 1, wherein the second material layer has a thickness between 50 nanometers and 450 nanometers.

4. The IC package support of claim 1, wherein the conductive line has a thickness between 10 microns and 20 microns.

5. The IC package support of claim 1, wherein the second material layer includes silicon and nitrogen having a ratio of silicon to nitrogen of 3 to 4.

6. The IC package support of claim 1, wherein the IC package support is a package substrate or an interposer.

7. An integrated circuit (IC) package support, comprising:

a conductive line, a first material layer on a top surface and on side surfaces of the conductive line, the first material layer including silver, and a second material layer on the first material layer, the second material layer including silicon or aluminum, and one or more of nitrogen and oxygen, wherein the conductive line is a first conductive line, and the IC package support further includes:

a second conductive line, wherein the first material layer is on a top surface and on side surfaces of the second conductive line and the second material layer is on the first material layer.

8. The IC package support of claim 7, wherein the IC package support further includes:

a first layer of dielectric material;

a first conductive plane embedded in the first layer of dielectric material, wherein the first material layer is on a top surface and on side surfaces of the first conductive plane and the second material layer is on the first material layer;

a second layer of dielectric material on the first layer of dielectric material, the first and second conductive lines embedded in the second layer of dielectric material;

a third layer of dielectric material on the second layer of dielectric material; and a second conductive plane embedded in the third layer of dielectric material, wherein the first material layer is on a top surface and on side surfaces of the second conductive plane and the second material layer is on the first material layer.

9. The IC package support of claim 8, wherein the IC package support further includes:

a first conductive pad embedded in the first layer of dielectric material, wherein the first material layer is on a top surface and on side surfaces of the first conductive pad and the second material layer is on the first material layer;

a second conductive pad embedded in the second layer of dielectric material, wherein the first material layer is on a top surface and on side surfaces of the second conductive pad and the second material layer is on the first material layer; and a conductive via between the first and second conductive pads, wherein the conductive via extends through the first and second material layers on the top surface of the first conductive pad.

10. An electronic assembly, comprising:

an integrated circuit (IC) package support, including a conductive structure in a layer of dielectric material, the conductive structure having a first material layer on and in contact with a top surface and side surfaces of the conductive structure and a second material layer on and in contact with the first material layer on the top surface and side surfaces of the conductive structure, wherein the first material layer includes silver and the second material layer includes silicon or aluminum, and one or more of nitrogen and oxygen.

11. The electronic assembly of claim 10, wherein the first material layer has a thickness between 50 nanometers and 450 nanometers.

12. The electronic assembly of claim 10, wherein the second material layer has a thickness between 50 nanometers and 450 nanometers.

13. The electronic assembly of claim 10, wherein the conductive structure is a conductive line in a transmission line structure.

14. The electronic assembly of claim 13, wherein the transmission line structure further includes a first conductive plane below the conductive line and a second conductive plane above the conductive line.

15. The electronic assembly of claim 10, wherein the IC package support further includes conductive contacts and the electronic assembly further includes one or more dies coupled to the conductive contacts.

16. The electronic assembly of claim 10, wherein the IC package support is included in an IC package, the electronic assembly further includes a circuit board, and the IC package is coupled to the circuit board.

17. A method of manufacturing an integrated circuit (IC) package support, comprising:

forming a conductive line;

forming a first layer of material on and in contact with a top surface and side surfaces of the conductive line, wherein the first layer of material includes silver;

forming a second layer of material on and in contact with the first layer of material on the top surface and side surfaces of the conductive line, wherein the second layer of material includes silicon or aluminum, and one or more of nitrogen and oxygen; and forming a layer of dielectric material on the second layer of material, wherein the conductive line is embedded in the layer of dielectric material.

18. The method of claim 17, wherein the first layer of material has a thickness between 50 nanometers and 450 nanometers.

19. The method of claim 17, wherein the second layer of material has a thickness between 50 nanometers and 450 nanometers.

20. The method of claim 17, wherein the layer of dielectric material includes an organic, polymer-based film.

* * * * *